US009842733B2

(12) United States Patent
Esmaeil Zaghi et al.

(10) Patent No.: US 9,842,733 B2
(45) Date of Patent: Dec. 12, 2017

(54) METHOD FOR DISSOLVING CHALCOGEN ELEMENTS AND METAL CHALCOGENIDES IN NON-HAZARDOUS SOLVENTS

(71) Applicant: IMEC VZW, Leuven (BE)

(72) Inventors: Armin Esmaeil Zaghi, Teheran (IR); Jozef Petrus Coleta Vleugels, Olen (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/894,987

(22) PCT Filed: May 14, 2014

(86) PCT No.: PCT/EP2014/060232
§ 371 (c)(1),
(2) Date: Nov. 30, 2015

(87) PCT Pub. No.: WO2014/198497
PCT Pub. Date: Dec. 18, 2014

(65) Prior Publication Data

US 2016/0111283 A1 Apr. 21, 2016

(30) Foreign Application Priority Data

Jun. 11, 2013 (EP) .................................... 13171384

(51) Int. Cl.

| | |
|---|---|
| ***H01L 21/20*** | (2006.01) |
| ***H01L 21/02*** | (2006.01) |
| ***C01B 19/00*** | (2006.01) |
| ***C01G 3/00*** | (2006.01) |
| ***C01G 15/00*** | (2006.01) |
| ***H01L 31/032*** | (2006.01) |
| ***H01L 31/18*** | (2006.01) |

(52) U.S. Cl.
CPC ...... *H01L 21/02568* (2013.01); *C01B 19/002* (2013.01); *C01G 3/006* (2013.01); *C01G 15/00* (2013.01); *C01G 15/006* (2013.01); *H01L 21/02628* (2013.01); *H01L 21/02667* (2013.01); *H01L 31/032* (2013.01); *H01L 31/18* (2013.01); *H01L 31/1872* (2013.01); *C01P 2004/64* (2013.01); *H01L 21/0256* (2013.01)

(58) Field of Classification Search
CPC ....... C01B 19/00; C01B 19/002; C09D 11/00; H01L 21/02568; H01L 21/02628; H01L 21/02667; H01L 31/032; H01L 31/18; H01L 31/1872; H01L 21/0256; C01G 3/006; C01G 15/00; C01G 15/006; C01P 2004/64
USPC ........................................................ 438/502
See application file for complete search history.

(56) References Cited

U.S. PATENT DOCUMENTS

| | | | | |
|---|---|---|---|---|
| 2009/0260670 | A1* | 10/2009 | Li | C09D 11/02 136/244 |
| 2011/0014377 | A1 | 1/2011 | Mosley | |
| 2011/0020981 | A1* | 1/2011 | Mosley | C01B 19/00 438/102 |
| 2013/0034933 | A1 | 2/2013 | Calzia et al. | |
| 2013/0040419 | A1 | 2/2013 | Calzia et al. | |
| 2013/0118585 | A1* | 5/2013 | Anderson | C09D 11/52 136/264 |

FOREIGN PATENT DOCUMENTS

| | | |
|---|---|---|
| CN | 103043628 | 4/2013 |
| WO | WO 2009/120716 | 10/2009 |

OTHER PUBLICATIONS

Simpson and Weiner, "The Oxford English Dictionary", 1989, Clarendon Press, V 20.*

* cited by examiner

*Primary Examiner* — Trung Q Dang
*Assistant Examiner* — Patricia Reddington
(74) *Attorney, Agent, or Firm* — Knobbe Martens Olson & Bear, LLP

(57) ABSTRACT

The present disclosure provides a method of preparing a chalcogen containing solution that is hydrazine free and hydrazinium free, wherein the method comprises: providing a predetermined amount of elemental chalcogen; providing a predetermined amount of elemental sulfur; providing an amine solvent; and combining the predetermined amount of elemental chalcogen and the predetermined amount of elemental sulfur in the amine solvent, thereby dissolving the elemental chalcogen and the elemental sulfur in the amine solvent. The chalcogen containing solution can advantageously be used as a precursor for the formation of a chalcogen containing layer on a substrate.

14 Claims, No Drawings

METHOD FOR DISSOLVING CHALCOGEN ELEMENTS AND METAL CHALCOGENIDES IN NON-HAZARDOUS SOLVENTS

INCORPORATION BY REFERENCE TO RELATED APPLICATIONS

Any and all priority claims identified in the Application Data Sheet, or any correction thereto, are hereby incorporated by reference under 37 CFR 1.57. This application is the national phase under 35 U.S.C. §371 of prior PCT International Application No. PCT/EP2014/060232 which has an International Filing Date of May 19, 2014, which designates the United States of America, and which claims priority to European Application No. 13171384.4 filed Jun. 11, 2013. Each of the aforementioned applications is incorporated by reference herein in its entirety, and each is hereby expressly made a part of this specification.

TECHNICAL FIELD

The present disclosure is related to methods for dissolving chalcogen elements such as selenium and/or tellurium and metal chalcogenides in non-hazardous solvents, such as amine base organic solvents.

The present disclosure further relates to methods for forming solid chalcogen containing layers on a substrate, for example for forming active layers of photovoltaic cells.

BACKGROUND ART

Solution based processing is a low cost technique that may advantageously be used for electronics fabrication, for example by printing. A wide range of inorganic and mostly organic materials have been developed in the form of inks that can be used as a precursor for printing electronics. One of the major technological challenges however is the formation of semiconductor layers with good electronic properties via such inks and printing techniques. The fabrication of semiconductor quality inorganic films via ink and printing techniques is very challenging due to defects and impurities that can be introduced into the material during the ink formation and film fabrication.

An interesting group of inorganic semiconductor materials for printing electronics are metal chalcogenides, composed of one or more metal atoms from Group 1 to Group 15 of the periodic table, including Lanthanides and Actinides, with one or more Group 16 elements (S, Se, Te). Chalcogenide semiconductors have interesting optical and electronic properties. Their band gap and electronic properties can be tuned by elemental substitution and compositional adjustment. The high tolerance against compositional variation and defects, together with a good electronic mobility, make chalcogenide semiconductors an interesting candidate for printing electronic applications. Two dimensional electronic conduction was recently discovered in some chalcogenides ($MoS_2$, $WS_2$), bringing more attention to chalcogenide materials as a novel family of electronic materials.

Chalcogenide materials have a complicated and unique chemistry, due to the different nature of chemical bonds in metal chalcogenides compared to most other salts. Metal chalcogenides have a covalent structure which gives them unique physical and chemical properties. For example, unlike most salts (such as metal halides) which are quite soluble in aqueous media and many other polar solvents, metal chalcogenides are insoluble in aqueous media and typical organic solvents. Therefore, due to the unique and complicated chemistry of chalcogenide materials, solution processing of such materials is challenging.

Different approaches have been developed for the formation of liquid sources of chalcogenide materials (inks), which can be divided in two general routes: the nanoparticle route and the solution route. The nanoparticle route is based on dispersing of chalcogenide nanoparticle compounds in a liquid carrier. The solution route is based on dissolving metal salts, chalcogenide compounds or constituent elements and chalcogen elements (S, Se, Te) at the molecular scale in a liquid carrier.

The applicability of these techniques is typically evaluated based on the quality of the resulting chalcogenide layer, and the potential for up-scaling of the process from a lab-scale to an industrial scale.

The main challenge in the solution routes for processing chalcogenide materials is in finding a suitable solvent and conditions for dissolving the chalcogenide compounds and especially the chalcogen elements (S, Se, Te).

For example, it is known that chalcogens such as Se can be dissolved in hydrazine ($N_2H_4$). However, since hydrazine is a very hazardous chemical (very toxic and explosive), applying this method requires many safety precautions, which limits the up-scaled use of this method.

In "Study of the dissolution behavior of selenium and tellurium in different solvents—a novel route to Se, Te tubular bulk single crystals", Jun Lu et al, J. Mater. Chem., 2002, 12, 2755-2761, the formation of homogenous solutions of Se and Te in ethylenediamine ($C_2N_2H_8$) is reported. This process however requires the use of an autoclave and heating to 180° C. It is a disadvantage of this approach that at such temperature the ethylenediamine has a high toxicity, flammability and corrosivity.

Another approach is for example described in US 2011/0014377. A method is proposed for preparing a selenium ink comprising Se stably dissolved in a liquid medium, wherein the selenium ink is hydrazine free and hydrazinium free. In this method, selenium is dissolved in an amine solvent by adding a traceless reducing agent such as for example ammonium formate ($NH_4CHO_2$) and formic acid ($CH_2O_2$). This method is quite simple and useful for the formation of selenium ink and the coating of metal chalcogenides. However, it requires the use of additives such as ammonium formate and formic acid to trigger the dissolution of selenium in amine solvents. This introduces oxygen atoms into the solution which can be detrimental for chalcogenide semiconductors. Moreover, the decomposition and removal of chemical additives might cause organic reactions and degassing, complicating the post-coating heat treatment process. Therefore, more simple chalcogen and chalcogenide solutions with less additives are preferred.

SUMMARY OF THE DISCLOSURE

The present disclosure aims to provide methods for dissolving chalcogen elements such as selenium and/or tellurium and metal chalcogenides in non-hazardous solvents, such as amine base organic solvents, at low temperature, and without additives that could introduce oxygen atoms into the solution.

In a first aspect, the present disclosure relates to methods of preparing a chalcogen containing solution that is hydrazine free and hydrazinium free. A method of the present disclosure comprises: providing a predetermined amount of elemental chalcogen; providing a predetermined amount of elemental sulfur; providing an amine solvent; and combining the predetermined amount of elemental chalcogen and the predetermined amount of elemental sulfur in the amine solvent, for instance without heating, thereby dissolving the elemental chalcogen and the elemental sulfur in the amine solvent and forming the solution.

According to preferred embodiments, combining the predetermined amount of elemental chalcogen and the predetermined amount of elemental sulfur in the amine solvent, is performed at low temperature. A low temperature is preferably a temperature below or smaller than the amine solvent's boiling point. In preferred embodiments, the temperature is ambient temperature, for instance a temperature within the range of 15° C. to 30° C., or within the range of 20° C. to 25° C. In these cases, there is no need for heating, i.e. no need for applying a dedicated heating step or process.

The elemental chalcogen can for example be elemental selenium or elemental tellurium. The amine solvent can for example be n-butylamine, the present disclosure not being limited thereto.

In embodiments of the present disclosure the atomic ratio between the predetermined amount of elemental chalcogen, e.g. elemental selenium or elemental tellurium, and the predetermined amount of elemental sulfur, can for example be in the range between 0.01 and 100, e.g. in the range between 0.1 and 10. However, other suitable ratios can be used.

It was surprisingly found that the presence of elemental sulfur in the amine solvent strongly enhances the solubility of elemental chalcogens in the amine solvent.

The method of the present disclosure may further comprise stirring after combining the elemental chalcogen and the elemental sulfur in the amine solvent.

The method may further comprise adding a predetermined amount of at least one elemental metal to the amine solvent. The elemental metal can for example be selected from the group consisting of: metals from Group 1 to Group 15 in the periodic table of chemical elements, including Lanthanides and Actinides.

The method may further comprise adding a predetermined amount of at least one metal salt to the amine solvent, wherein the metal of the metal salt is selected from the group consisting of: metals from Group 1 to Group 15, including Lanthanides and Actinides.

The method may further comprise adding a predetermined amount of at least one metal hydroxide to the amine solvent, wherein the metal of the metal hydroxide is selected from the group consisting of: metals from Group 1 to Group 15, including Lanthanides and Actinides.

A chalcogen containing solution prepared in accordance with a method of the present disclosure can for example be used as a liquid source (ink) of chalcogenide material. It can for example be used as an ink in a solution based processing method, e.g. for forming a solid layer on a substrate.

In a second aspect, the present disclosure relates to methods for forming a chalcogen containing layer on a substrate, wherein the method comprises: preparing a chalcogen (e.g. selenium or tellurium) containing solution using a method according to the first aspect; coating the solution on the substrate; and performing a drying step, thereby transforming the liquid solution into a solid layer. The method may further comprise performing subsequently an annealing step, thereby inducing phase formation and crystallization of the solid layer (chalcogenization) and improving its physical and electronic properties. The annealing step can for example be done at a temperature in the range between 400° C. and 700° C., for about 10 minutes to 60 minutes, for instance a duration within the range of 10 to 60 minutes, the present disclosure not being limited thereto.

The method for forming a chalcogen containing layer on a substrate can for example be used for forming chalcogen containing semiconductor layers, e.g. as active layer of thin film transistors, light emitting diodes, or photovoltaic devices, such as for example CIGS [$CuInGaSe_2$] or CZTS [$Cu_2ZnSnSe_4$] based photovoltaic cells.

In a third aspect the present disclosure relates to methods for reducing a particle size of a chalcogenide material, wherein the method comprises: providing a chalcogenide material having a first average particle size; preparing a sulfur containing amine solution; and performing a wet ball milling process, wherein the sulfur containing amine solution is added as a liquid medium to the chalcogenide material during milling, thereby reducing the average particle size of the chalcogenide material to a second average particle size substantially smaller than the first average particle size.

Reducing the average particle size can for example comprise reducing the average size of the particles till they have a diameter (second particle size) in the range between 10 nm and 100 nm, the present disclosure not being limited thereto.

Preparing the sulfur containing amine solution can comprise: providing a predetermined amount of elemental sulfur; providing an amine solvent; and combining the elemental sulfur in the amine solvent, for instance without heating, for instance at a temperature below the amine solvent's boiling point, for instance at ambient temperature, thereby dissolving the elemental sulfur in the amine solvent and forming the sulfur containing amine solution.

The method according to the third aspect of the present disclosure can advantageously be used for preparing chalcogenide nanomaterials, e.g. chalcogenide nanopowders.

It is an advantage of embodiments of the present disclosure that chalcogen containing solutions, chalcogen containing layers and chalcogen nanomaterials can be prepared without using hazardous materials.

It is an advantage of embodiments of the present disclosure that chalcogen containing solutions and chalcogen nanomaterials can be prepared without the need for performing a heating step, or with a limited heating step.

It is an advantage of embodiments of the present disclosure that the chalcogen containing solutions, chalcogen containing layers and chalcogen containing nanomaterials are only composed of coherent chalcogen elements and metal elements and/or chalcogenide compounds and that they do not contain any other additives that could for example lead to the incorporation of oxygen.

It is an advantage of embodiments of the present disclosure that different chalcogen elements can be co-dissolved in a single solution. Such solution containing different chalcogen elements can for example be used for the formation of inks for complicated chalcogenide systems.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

DETAILED DESCRIPTION

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments, the disclosure is not limited hereto.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The present disclosure provides methods for preparing a chalcogen (e.g. selenium or tellurium) containing solution that is hydrazine free and hydrazinium free. A method of the present disclosure comprises: providing a predetermined amount of elemental chalcogen (e.g. elemental selenium or elemental tellurium); providing a predetermined amount of elemental sulfur; providing an amine solvent; and combining the predetermined amount of elemental chalcogen and the predetermined amount of elemental sulfur in the amine solvent, for instance without heating, thereby dissolving the elemental chalcogen and the elemental sulfur in the amine solvent and forming the solution.

In a method of the present disclosure, the elemental sulfur is used as an additive that enables the dissolution of the chalcogen in an amine solvent at low temperature, for instance at a temperature below the amine solvent's boiling point, for instance at ambient temperature (room temperature), i.e. without heating.

The present disclosure is further described for embodiments wherein the chalcogen is selenium. However, the present disclosure is not limited thereto and the methods of the present disclosure can also be used with other chalcogens.

Elemental selenium has a limited solubility in most organic and amine base solvents at room temperature, in the order of a few micrograms per ml. It was surprisingly found that the solubility of selenium in amine base solvents can be substantially increased by adding elemental sulfur to the solution at room temperature. It was found that this allows obtaining a solubility of selenium in amine base solvents in the order of 100 mg/ml or even higher.

For example, in embodiments of the present disclosure, n-butylamine ($C_4H_9NH_2$), pentylamine ($C_5H_{11}NH_2$), ethylenediamine ($C_2N_2H_8$) or 2-pyrrolidone can be used as an amine base solvent. However, the present disclosure is not limited thereto and other suitable solvents can be used. It is an advantage of using e.g. n-butylamine that it is safer and easier to use as compared to for example hydrazine ($N_2H_4$), ethylenediamine ($C_2N_2H_8$) or carbon disulfide ($CS_2$).

In a method of the present disclosure, the atomic ratio of selenium to sulfur in the solution can vary in a wide range. The amount of dissolved selenium can be much higher than the amount of added sulfur. For example, selenium to sulfur atomic ratios in the range between 0.01 and 100 can be used. However, the present disclosure is not limited thereto, and other selenium to sulfur atomic ratios can also be used. Thus, stable solutions of selenium and sulfur can be formed with a wide range of sulfur and selenium content. It was observed that the dissolving rate of selenium depends strongly on the sulfur to selenium ratio: the higher the content of sulfur in the solution the faster the dissolving rate of selenium.

Sulfur dissolves very well in most amine base solvents, and it was surprisingly found that it can help to dissolve selenium as well. Although the elemental sulfur dissolves in n-butylamine almost immediately, the dissolving of selenium in the same solution can take several days.

Sulfur and selenium are both chalcogen elements and in most chalcogenide materials, sulfur and selenium atoms can substitute each other without damaging the structural and electronic properties of the material. Moreover, atomic substitution of sulfur and selenium in chalcogenide semiconductors is an easy way for tuning the semiconducting band gap and electronic properties. Therefore, having a homogeneous solution of sulfur and selenium by its nature is an advantage for solution processing of chalcogenide semiconductors.

In an experiment, elemental selenium together with sulfur were dissolved in n-butylamine at different selenium/sulfur molar ratios. For example, solutions of 1200 mg Se (15 mmol)+160 mg S (5 mmol) in 10 ml n-butylamine, or 1200 mg Se (15 mmol)+98 mg S (3 mmol S) in 10 ml n-butylamine or 1200 mg Se (15 mmol)+50 mg (1.5 mmol S) in 10 ml n-butylamine were prepared by stirring at room temperature for several days.

It was observed that the elemental sulfur dissolved in n-butylamine almost immediately, while the complete dissolution of selenium in the sulfur-doped amine solution can take up to several days. The dissolving rate of selenium depends on the sulfur to selenium ratio. A higher sulfur to selenium ratio enhances the dissolving rate of selenium. After completing the dissolving process, dark viscous brownish red stable solutions are formed.

The dissolution rate can also be increased by heating to a temperature below the amine solvent boiling point. For example, when using n-butylamine as a solvent, heating can be done up to a temperature in the range between 50° C. and 60° C. to increase the chalcogen, e.g. selenium, dissolution rate.

Without being bound by theory, a possible explanation for the increased solubility of selenium in n-butylamine by adding sulfur may be related to the similar chemistry of sulfur and selenium and the formation of sulfur-selenium bonds. Dissolving sulfur in amine solvents forms free sulfur radicals and ionic sulfur organic compounds. These free radicals and ionic sulfur organic species are active compounds that can react with the selenium as well as other metallic species, and that can form organic sulfur-selenium groups which are soluble in amine solvents.

As experimentally observed, the dissolution rate of selenium strongly depends on the sulfur to selenium ratio, since a higher content of sulfur in the solution enhances the dissolving rate of selenium. Without being bound by theory, an increased concentration of sulfur in amine solvents may increase the concentration of sulfur radicals and ionic organic compounds in solution that initiate and enhance the co-dissolution of metallic selenium.

Due to the similar chemical properties of chalcogen elements (S, Se, Te) and chalcogenides, tellurium is most probably also soluble in sulfur doped amine solutions.

Sulfur/selenium amine solutions prepared according to a method of the present disclosure can for example be used as an ink for forming sulfur-selenium layers, such as for example for electronic applications (e.g. large area electronics) or for photovoltaic applications, such as for example CIGS [$CuInGaSe_2$] or CZTS [$Cu_2ZnSnSe_4$] based photovoltaic cells.

When applying the sulfur/selenium solution on a substrate by a conventional coating technique such as drop casting, spin coating or blade coating, the amine (n-butylamine) solvent evaporates (drying step), leaving a precipitate coating containing sulfur and selenium with a small amount of solvent molecules. After drying of the solution, a solid layer is formed on the substrate. The composition of this coating is determined by the elemental composition of the ink. There is no loss of sulfur or selenium during drying. After the drying step, optionally an annealing step can be done for phase formation and crystallization (chalcogenization). The annealing step can for example be done at a temperature in the range between 400° C. and 700° C., e.g. between 400° C. and 600° C., e.g. for a duration of about 10 minutes to 60 minutes, or a duration within 10 minutes to 60 minutes.

In an industrial coating deposition process, solvents that are more suitable for coating, such as for example BGA (butyl glycol acetate) or pentanediol, can be added to the solution.

Additional elemental metals, such as for example elemental copper and/or elemental indium, may be dissolved in a sulfur-selenium amine solution of the present disclosure.

Without being bound by theory, the dissolution of such additional elemental metals may be due to a similar mechanism as described above in the context of dissolving selenium, and/or it may be due to formation of metal-amine complexes. Some amorphous chalcogenide nanostructures may be formed in the solution at room temperature. This homogenous solution can be used as an ink for forming chalcogenide materials.

The solutions prepared according to a method of the present disclosure can be precipitated by adding ethanol or other alcohols and solvents. The precipitate material can also be used as a precursor for chalcogenide materials. For example, experiments were done wherein solutions of Cu—S—Se, In—S—Se and Cu—In—S—Se were prepared, and afterwards precipitated by adding ethanol. These solutions are specifically interesting for defining active layers of electronic devices, as for instance photovoltaic devices. This method can also be applied with other elemental metals to form precursors for other metal chalcogenides, such as for example Ga—S—Se, Zn—S—Se, Sn—S—Se, and Mo—S—Se, the present disclosure not being limited thereto.

Alternatively, instead of elemental metals, metal salts may be dissolved in sulfur-selenium amine solutions of the present disclosure, for example for the preparation of precursors for chalcogenide materials.

In an experiment CuCl and $InCl_3$ salts were dissolved in a solution of sulfur-selenium in n-butylamine at room temperature, forming a dark stable solution. The dissolution of copper and indium salts showed the advantage that it was much faster than that of elemental Cu and In particles. Without being bound by theory, amorphous chalcogenide nanostructures may be formed in the CuCl and $InCl_3$ sulfur-selenium n-butylamine solution at room temperature. This solution can be used as a precursor ink for chalcogenide materials.

The solution of CuCl and $InCl_3$ salts in sulfur-selenium in n-butylamine was coated on a Mo-coated glass substrate and heat treated in Ar at 500° C. for 15 minutes. EDS and XRD analysis showed that the resulting layer was phase pure $CuInSe_2$. This experiment illustrates the possible use of a solution of metal salts dissolved in a S—Se amine solution as a precursor for chalcogenide materials.

This method can also be applied with other metal salts to form precursors for other metal chalcogenide systems.

A similar experiment was performed with metal hydroxides and a S—Se Solution in n-butylamine, resulting in a similar coating. For improving the quality and purity of the chalcogenide layer, a variety of metal salts with volatile anion groups can be used, such as metal-nitrates (NO3-), metal-formates ($CHO_2$—), acetates ($CH_2CO_2$—) thiolates (R—CS—), dithiocarboxylics (R—$CS_2$—), thiocyanates (SCN—), the present disclosure not being limited thereto.

In another aspect of the present disclosure, sulfur containing amine solutions are used as an effective de-agglomerating medium for chalcogenide materials during mechanical synthesis of chalcogenide nanopowders and nanostructures.

It is known that applying a de-agglomeration medium during wet ball-milling processes results in a significant size reduction of the nanostructures formed. The use of mechanical alloying and milling techniques for the preparation of chalcogenide powders and nanopowders has been reported. It is also known to use (e.g. during ball milling) dispersants for effective size reduction of the chalcogenide nanopowders and nanostructures formed. However, these dispersants may need to be washed away after the size reduction process.

In a third aspect of the present disclosure, a sulfur containing amine solution is used as an effective de-agglomerating wet medium during e.g. ball milling for the formation of chalcogenide nanomaterials. Since it was surprisingly found that sulfur containing amine solutions can dissolve chalcogenides and metallic compounds, it is proposed here to use such sulfur containing amine solutions as a very effective de-agglomerating medium for chalcogenide material production.

During ball milling, the sulfur containing amine solution can dissolve chalcogenide solid particles especially along grain boundary regions. This causes the chalcogenide powders to lose their mechanical strength and easily separate into smaller particles in the wet media.

It was experimentally observed that polycrystalline chalcogenide solids (for example $CuInSe_2$ or $Cu_2ZnSnSSe_4$) ball milled in a sulfur amine solution resulted in a very fast size reduction and the formation of nanometer sized (down to 20 nm shown) chalcogenide nanoparticles. The particle size range can be controlled by controlling the concentration of sulfur in the amine solvent as well as by controlling the milling parameters, such as milling speed, ball to powder ratio and milling time.

This technique is most suitable for the low cost mass production of chalcogenide nanopowders. Nanopowders (e.g. with a particle size down to 10 nm) of high purity chalcogenide materials of any chosen composition can be mass produced in a few hours. The chalcogenide nanopowders obtained by this technique can be used as a precursor material for printing electronics.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

The invention claimed is:

1. A method of preparing a chalcogen-containing solution that is hydrazine free and hydrazinium free, the method comprising:

providing a predetermined amount of a first material consisting of pure elemental chalcogen;

providing a predetermined amount of a second material consisting of pure elemental sulfur;

providing an amine solvent; and combining the predetermined amount of the first material consisting of the pure elemental chalcogen and the predetermined amount of the second material consisting of the pure elemental sulfur in the amine solvent at ambient temperature, whereby the first material consisting of the pure elemental chalcogen and the second material consisting of the pure elemental sulfur are dissolved in the amine solvent, thereby forming a chalcogen-containing solution that is hydrazine free and hydrazinium free.

2. The method of claim 1, whereby combining the predetermined amount of the first material consisting of the pure elemental chalcogen and the predetermined amount of the second material consisting of the pure elemental sulfur in the amine solvent is performed at a temperature below a boiling point of the amine solvent.

3. The method of claim 1, wherein the pure elemental chalcogen is pure elemental selenium or pure elemental tellurium.

4. The method of claim 1, wherein the amine solvent is n-butylamine.

5. The method of claim 1, wherein an atomic ratio between the predetermined amount of the first material consisting of the pure elemental chalcogen and the predetermined amount of the second material consisting of the pure elemental sulfur is from 0.01 to 100.

6. The method of claim 1, wherein an atomic ratio between the predetermined amount of the first material consisting of the pure elemental chalcogen and the predetermined amount of the second material consisting of the pure elemental sulfur is from 0.1 to 10.

7. The method of claim 1, further comprising stirring, after combining, the first material consisting of the pure elemental chalcogen and the second material consisting of the pure elemental sulfur in the amine solvent.

8. The method of claim 1, further comprising adding a predetermined amount of a third material consisting of at least one pure elemental metal to the amine solvent, wherein the pure elemental metal is selected from the group consisting of metals from Group 1 to Group 15 of the periodic table, Lanthanides, and Actinides.

9. The method of claim 1, further comprising adding a predetermined amount of at least one metal salt to the amine solvent, wherein the metal of the metal salt is selected from the group consisting of metals from Group 1 to Group 15 of the periodic table, Lanthanides, and Actinides.

10. The method of claim 1, further comprising adding a predetermined amount of at least one metal hydroxide to the amine solvent, wherein the metal of the metal hydroxide is selected from the group consisting of metals from Group 1 to Group 15 of the periodic table, Lanthanides, and Actinides.

11. A method for forming a chalcogen or chalcogenide containing layer on a substrate, the method comprising:

dissolving an elemental chalcogen and elemental sulfur in an amine solvent thereby forming a chalcogen-containing solution that is hydrazine free and hydrazinium free wherein the elemental chalcogen is pure elemental chalcogen, and wherein the elemental sulfur is pure elemental sulfur:

coating the chalcogen-containing solution on a substrate; drying the solution, thereby transforming the solution into a solid layer; and performing an annealing step, thereby inducing phase formation and crystallization of the solid layer, wherein performing the annealing step comprises heating to a temperature of from 400° C. to 700° C.

12. The method of claim 1, wherein the ambient temperature is a temperature within a range of 15° C. to 30° C.

13. The method of claim 1, wherein the ambient temperature is a temperature within a range of 20° C. to 25° C.

14. The method of claim 1, wherein combining the predetermined amount of the first material consisting of the pure elemental chalcogen and the predetermined amount of the second material consisting of the pure elemental sulfur in the amine solvent is conducted in an absence of heating.

* * * * *

UNITED STATES PATENT AND TRADEMARK OFFICE

CERTIFICATE OF CORRECTION

PATENT NO. : 9,842,733 B2
APPLICATION NO. : 14/894987
DATED : December 12, 2017
INVENTOR(S) : Armin Esmaeil Zaghi It is certified that error appears in the above-identified patent and that said Letters Patent is hereby corrected as shown below:

On the Title Page

Item (22), PCT Filed at Line 1, Change “May 14,” to -- May 19, --

Signed and Sealed this
Tenth Day of April, 2018

Andrei Iancu
*Director of the United States Patent and Trademark Office*